United States Patent
Black et al.

(10) Patent No.: US 10,193,522 B2
(45) Date of Patent: Jan. 29, 2019

(54) SINGLE PORT WIDE BAND IMPEDANCE MATCHING CIRCUIT WITH NARROW BAND HARMONIC BYPASS, WIRELESS COMMUNICATION DEVICE, AND METHOD FOR PROVIDING ANTENNA MATCHING

(71) Applicant: Motorola Mobility LLC, Chicago, IL (US)

(72) Inventors: Gregory R Black, Vernon Hills, IL (US); Brian H Bremer, Arlington Heights, IL (US)

(73) Assignee: Motorola Mobility LLC, Chicago, IL (US)

( * ) Notice: Subject to any disclaimer, the term of this patent is extended or adjusted under 35 U.S.C. 154(b) by 466 days.

(21) Appl. No.: 15/002,590

(22) Filed: Jan. 21, 2016

(65) Prior Publication Data

US 2017/0214378 A1    Jul. 27, 2017

(51) Int. Cl.
*H01Q 5/50* (2015.01)
*H03H 7/38* (2006.01)
*H01Q 1/24* (2006.01)

(52) U.S. Cl.
CPC .............. *H03H 7/38* (2013.01); *H01Q 1/243* (2013.01); *H01Q 5/50* (2015.01)

(58) Field of Classification Search
CPC ................................... H03H 7/38; H01Q 5/50
USPC ............................................................. 333/33
See application file for complete search history.

(56) References Cited

U.S. PATENT DOCUMENTS

| | | | |
|---|---|---|---|
| 2013/0250819 A1* | 9/2013 | Khlat | H04B 1/10 370/278 |
| 2014/0266455 A1* | 9/2014 | Kaatz | H03F 1/565 330/286 |
| 2015/0288400 A1* | 10/2015 | Nguyen | H04B 1/126 455/136 |

* cited by examiner

*Primary Examiner* — Stephen E. Jones
*Assistant Examiner* — Samuel S Outten
(74) *Attorney, Agent, or Firm* — Lawrence J. Chapa

(57) ABSTRACT

The present application provides a single port wide band impedance matching circuit and method for providing antenna matching. The single port wide band impedance matching circuit includes a single signal port adapted for receiving a wide band signal. The single port wide band impedance matching circuit further includes an impedance matching circuit including a narrow band harmonic bypass. Still further, the single port wide band impedance matching circuit includes an antenna port coupled to the single signal port via the impedance matching circuit.

18 Claims, 5 Drawing Sheets

SINGLE PORT WIDE BAND IMPEDANCE MATCHING CIRCUIT WITH NARROW BAND HARMONIC BYPASS, WIRELESS COMMUNICATION DEVICE, AND METHOD FOR PROVIDING ANTENNA MATCHING

FIELD OF THE APPLICATION

The present disclosure relates generally to impedance matching circuits for use with an antenna in a wireless communication device, and more particularly, to a single port impedance matching circuit with a harmonic bypass.

BACKGROUND

Wireless communication devices are continuously integrating new and enhanced features and capabilities, that leverage an ability to remotely transmit and receive data using wireless communication capabilities. As the features and capabilities are added and/or enhanced, there often is a need to communicate wirelessly an ever increasing amount of information/data in order to support the added and/or enhanced features and capabilities of the device. However, increasing a device's ability to communicate information/data wirelessly is complicated by a further desire to limit the overall size of the device, which can sometimes make desirable an ability to share some of the circuitry and structure, which is used to support various forms of wireless communications.

Diplexers can facilitate the sharing of resources by allowing multiple separate signals to be merged onto a single terminal through frequency domain multiplexing. For example, a diplexer can help facilitate a pair of ports each respectively associated with its own transceiver being coupled to a common shared port that can be associated with a single antenna. Diplexer are generally different than a combiner or splitter in that each of the ports to be merged are often frequency selective, which can also serve to allow multiple separate signals to be merged while helping to reduce the potential for interference between the signals being merged.

Some forms of wireless cellular communications, in order to increase the rate of data that can be communicated, will allow a larger amount of frequency bandwidth to be utilized in support of the communication through carrier aggregation, which can sometimes make use of non-contiguous frequency bands. The increase in available bandwidth for supporting a particular communication will often allow for a corresponding increase in the bitrate of the data being communicated via a signal using the increased amount of allocated bandwidth.

Conventionally, bands having carrier frequencies below about 800 MHz are referred to as ultralow bands. Bands between 800 MHz and 1500 MHz are often referred to as low bands. Bands between 1500 MHz and 2200 MHz are often referred to as mid bands, and bands greater than 2200 MHz are often referred to as high bands. Previously, cellular service providers have supported a number of two-downlink carrier aggregation band combinations, including simultaneous ultralow band or low band operation with mid band or high band operation. At least some filter suppliers promote signal combining using various diplexers, triplexers and quadriplexers in the front end of the wireless radio frequency communication circuitry separate from the antenna matching circuitry. While diplexing, triplexing, etc. type circuits in the front end portion of the radio frequency communication circuitry can be cheaper than incorporating the diplexing, triplexing, etc. functionality in a tunable antenna match, this type of circuit can result in antenna matching in the context of a wideband signal, wherein carrier aggregation can involve a harmonic being produced by a tuner with respect to one of the bands being aggregated, which is in a band of interest in another one of the bands being aggregated. A tunable antenna match can sometimes involve the use of a variable capacitor, which in at least some instances can have a less than desired linear response, which in turn can increase the likelihood of an undesirable harmonic being produced. The presence of the tuner harmonic can sometimes result in the desensitizing of one or both of the receivers involved in the carrier aggregation operation.

The present innovators have correspondingly recognized that the harmful tuner harmonics associated with matching a wideband signal with an antenna through the use of a variable capacitor having a less than optimal linear response, which can have a harmful effect in at least some forms of carrier aggregation, can be addressed by introducing a trap across the tuner device in the matching circuitry for suppressing problematic tuner harmonic frequencies. By making the trap tunable, the trap can be adjusted to account for various different frequencies that may be problematic at different times, depending upon which ones of the carrier frequencies are currently being aggregated.

SUMMARY

The present application provides a single port wide band impedance matching circuit. The single port wide band impedance matching circuit includes a single signal port adapted for receiving a wide band signal. The single port wide band impedance matching circuit further includes an impedance matching circuit including a narrow band harmonic bypass. Still further, the single port wide band impedance matching circuit includes an antenna port coupled to the single signal port via the impedance matching circuit.

In at least one embodiment, the impedance matching circuit includes a tunable antenna matching capacitance, and the narrow band harmonic bypass includes a series impedance in parallel with the tunable antenna matching capacitance of the impedance matching circuit. In at least some instances the series impedance is tunable. In at least some of these instances, the tunable series impedance includes a tunable series capacitor, where the tunable series impedance can additionally include a secondary trap comprising a combination of an inductor coupled in parallel with a capacitor, where the combination is coupled in series with the tunable series capacitor.

The present application further provides a method for providing antenna matching. The method includes coupling a single signal port including a wide band signal to an antenna port via an impedance matching circuit. The method further includes bypassing in the wide band signal at the single signal port, a narrow band harmonic of one of the signal frequencies contained in the wide band signal.

The present invention still further provides a wireless communication device. The wireless communication device includes one or more transceivers, which are coupled to a single signal port coupled to the one or more transceivers, the single signal port including a wide band signal associated with the one or more transceivers. The wireless communication device further includes an impedance matching circuit including a narrow band harmonic bypass, an antenna port coupled to the single signal port via the impedance matching circuit, and an antenna coupled to the antenna port.

These and other features, and advantages of the present disclosure are evident from the following description of one or more preferred embodiments, with reference to the accompanying drawings.

DETAILED DESCRIPTION OF THE PREFERRED EMBODIMENT(S)

Figure 1:
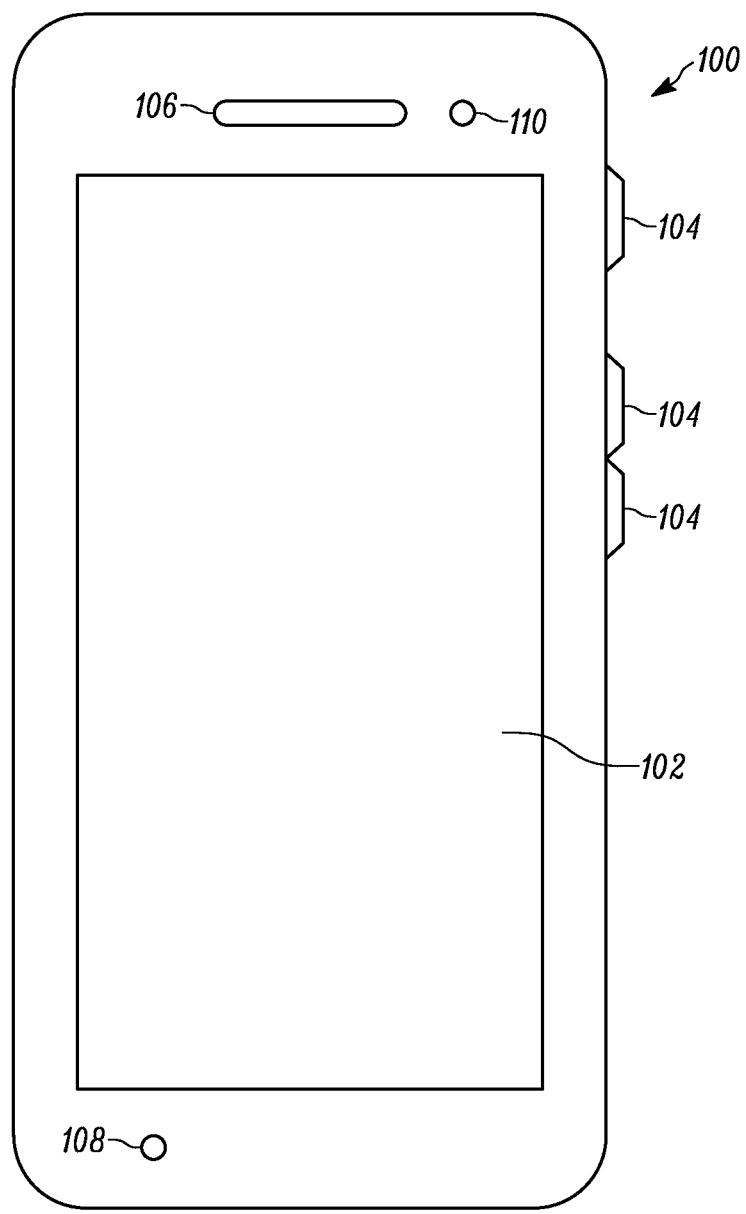
FIG. 1 is a front view of an exemplary wireless communication device.

While the present invention is susceptible of embodiment in various forms, there is shown in the drawings and will hereinafter be described presently preferred embodiments with the understanding that the present disclosure is to be considered an exemplification and is not intended to limit the invention to the specific embodiments illustrated. One skilled in the art will hopefully appreciate that the elements in the drawings are illustrated for simplicity and clarity and have not necessarily been drawn to scale. For example, the dimensions of some of the elements in the drawings may be exaggerated relative to other elements with the intent to help improve understanding of the aspects of the embodiments being illustrated and described.

FIG. 1 illustrates a front view of an exemplary wireless communication device 100, such as a wireless communication device. While in the illustrated embodiment, the type of wireless communication device shown is a radio frequency cellular telephone, other types of devices that include wireless radio frequency communication capabilities are also relevant to the present application. In other words, the present application is generally applicable to wireless communication devices beyond the type being specifically shown. A couple of additional examples of suitable wireless communication devices that may additionally be relevant to the present application in the incorporation and management of a single port wide band impedance matching circuit in support of wireless communications can include a tablet, a laptop computer, a desktop computer, a netbook, a cordless telephone, a selective call receiver, a gaming device, a personal digital assistant, as well as any other form of wireless communication device that might be used to manage multiband communications, wideband communications, and/or wireless communications involving one or more different communication standards. A few examples of different communication standards include Global System for Mobile Communications (GSM) Code Division Multiple Access (CDMA), Orthogonal Frequency Division Multiple Access (OFDMA), Long Term Evolution (LTE), Global Positioning System (GPS), Wi-Fi (IEEE 802.11), as well as various other communication standards. In addition, the wireless communication device 100 may utilize a number of additional various forms of communication including carrier aggregation and simultaneous voice and data that concurrently enables the use of simultaneous signal propagation.

In the illustrated embodiment, the radio frequency cellular telephone includes a display 102 which covers a large portion of the front facing. In at least some instances, the display can incorporate a touch sensitive matrix, that can help facilitate the detection of one or more user inputs relative to at least some portions of the display, including an interaction with visual elements being presented to the user via the display 102. In some instances, the visual element could be an object with which the user can interact. In other instances, the visual element can form part of a visual representation of a keyboard including one or more virtual keys and/or one or more buttons with which the user can interact and/or select for a simulated actuation. In addition to one or more virtual user actuatable buttons or keys, the device 100 can include one or more physical user actuatable buttons 104. In the particular embodiment illustrated, the device has three such buttons located along the right side of the device.

The exemplary hand held electronic device, illustrated in FIG. 1, additionally includes a speaker 106 and a microphone 108 in support of voice communications. The speaker 106 may additionally support the reproduction of an audio signal, which could be a stand-alone signal, such as for use in the playing of music, or can be part of a multimedia presentation, such as for use in the playing of a movie, which might have at least an audio as well as a visual component. The speaker may also include the capability to also produce a vibratory effect. However, in some instances, the purposeful production of vibrational effects may be associated with a separate element, not shown, which is internal to the device. Generally, the speaker is located toward the top of the device, which corresponds to an orientation consistent with the respective portion of the device facing in an upward direction during usage in support of a voice communication. In such an instance, the speaker 106 might be intended to align with the ear of the user, and the microphone 108 might be intended to align with the mouth of the user. Also located near the top of the device, in the illustrated embodiment, is a front facing camera 110. The wireless communication device will also generally include one or more radio frequency transceivers, as well as associated transmit and receive circuitry, including one or more antennas that may be positioned internally relative to the device.

Figure 2:
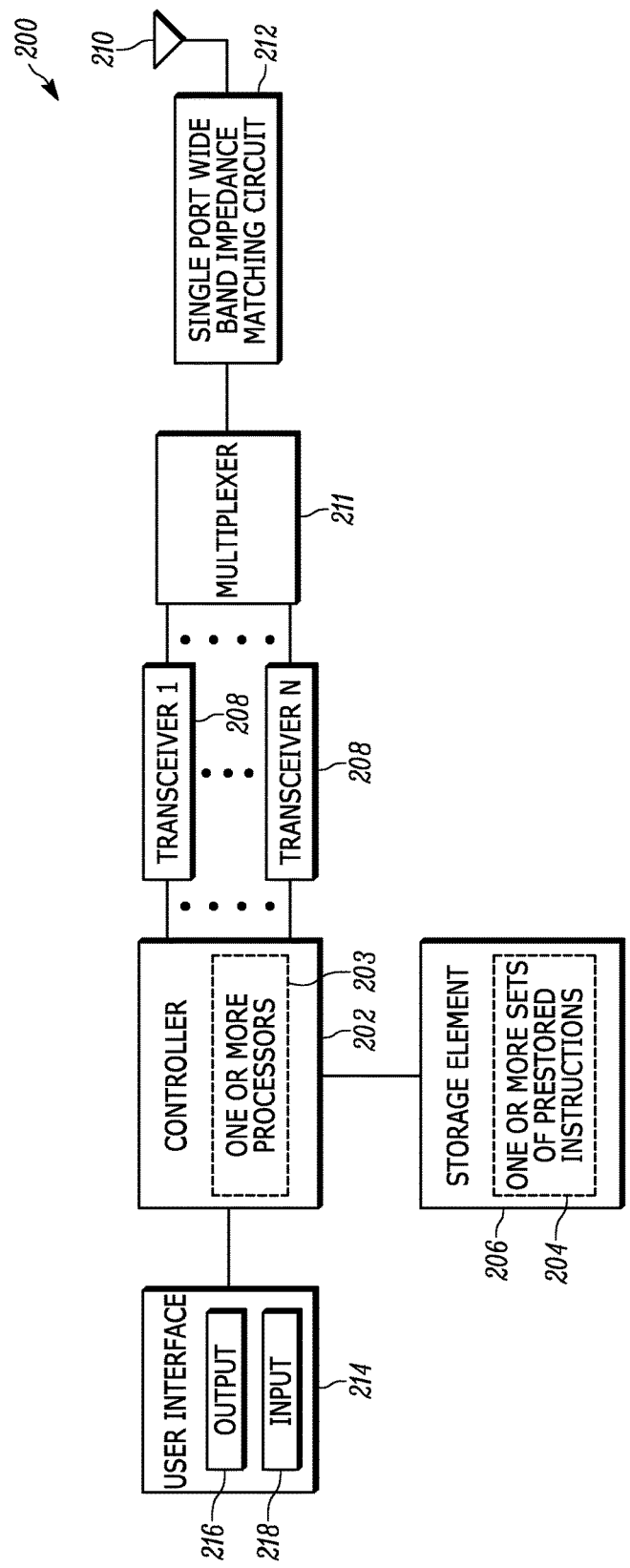
FIG. 2 is a block diagram of a wireless communication device.

FIG. 2 illustrates a block diagram 200 of a wireless communication device 100, in accordance with at least one embodiment. In the illustrated embodiment, the wireless communication device 100 includes a controller 202, which is adapted for managing at least some of the operation of the device 100. In some embodiments, the controller 202 could be implemented in the form of one or more processors 203, which are adapted to execute one or more sets of pre-stored instructions 204, which may be used to form or implement the operation of at least part of one or more controller modules including those used to manage wireless communication. The one or more sets of pre-stored instructions 204 may be stored in a storage element 206, which while shown as being separate from and coupled to the controller 202, may additionally or alternatively include some data storage capability for storing at least some of the prestored instructions for use with the controller 202, that are integrated as part of the controller 202.

The storage element 206 could include one or more forms of volatile and/or non-volatile memory, including conventional ROM, EPROM, RAM, or EEPROM. The possible additional data storage capabilities may also include one or more forms of auxiliary storage, which is either fixed or removable, such as a hard drive, a floppy drive, or a memory stick. One skilled in the art will still further appreciate that still other further forms of storage elements could be used without departing from the teachings of the present disclosure. In the same or other instances, the controller 202 may additionally or alternatively incorporate state machines and/or logic circuitry, which can be used to implement at least partially, some of the modules and/or functionality associated with the controller 202.

In the illustrated embodiment, the device further includes one or more transceivers 208, which are coupled to the controller 202 and which serve to manage the external communication of data including their wireless communication using one or more forms of communications. In such an instance, the transceivers will generally be coupled to an antenna 210 via which the wireless communication signals will be radiated and received. For example, the one or more transceivers 208 might include a receiver for supporting communications with a global positioning system, one or more transceivers for supporting cellular radio frequency communications, a transceiver for supporting Bluetooth® type communications, as well as a transceiver for supporting Wi-Fi® type communications. Transceivers for other forms of communication are additionally and/or alternatively possible. While in some instances each transceiver can be associated with a separate antenna, it is envisioned that in the present instance an antenna may be able to support multiple transceivers and/or multiple forms of communication. In the present instance, the one or more transceivers 208 are coupled to an antenna 210 via a multiplexer 211 and a single port wide band impedance matching circuit 212, which together can help to facilitate the multiple transceivers 208 simultaneously interacting with a common antenna 210. While a single antenna is illustrated as interacting with the multiple transceivers 208, it is possible that some of the one or more transceivers could be associated with its own or a different antenna. In other word, the present embodiment does not preclude some transceivers from operating with alternative additional antennas, but the multiplexer 211 and single port wide band impedance matching circuit 212 can help to assist multiple transceivers 208 in their separate and/or simultaneous operation with a single common antenna 210. The multiplexer 211 is intended to allow multiple ports, in this case each generally being associated with a respective transceiver, to be merged with a single shared port, which in the present instance is then coupled to an antenna 210 via an impedance matching circuit 212.

By including a multiplexer 211 as part of the front end of the wireless communication circuitry, separate from any impedance matching, it is possible to use standard, off the shelf components available from filter suppliers, which are often generally less expensive. The multiplexer 211 can include various combinations of diplexers, triplexers and quadriplexers. Multiplexing in the front end can also involve transmit and receive signal combining at the duplex filter. The inclusion of multiplexing in the front end will generally result in the use of a single port matching circuit. However one drawback to the use of at least some single port matching circuits in a wide band application, such as where carrier aggregation is being used, involves the possible receiver desensitization as a result of a harmonic from at least one frequency of interest being erroneously detected as a valid signal at another expected frequency of interest. In order to attempt to minimize the risk of these potential problems, the present disclosure includes a single port wide band impedance matching circuit 212, which incorporates a tunable harmonic suppression circuit in the form of a narrow band harmonic bypass circuit, which is discussed in greater detail below.

In the illustrated embodiment, the device 100 can additionally include user interface circuitry 214, some of which can be associated with producing an output 216 to be perceived by the user, and some of which can be associated with detecting an input 218 from the user. For example, the user interface circuitry 214 can include a display 102 adapted for producing a visually perceptible output, which may further support a touch sensitive array for receiving an input from the user. The user interface circuitry may also include a speaker 106 for producing an audio output, and a microphone 108 for receiving an audio input. The user interface output 216 could further include a vibrational element. The user interface input 218 could further include one or more user actuatable switches 104, one or more sensors, as well as one or more cameras 110. Still further alternative and additional forms of user interface elements may be possible.

Figure 3:
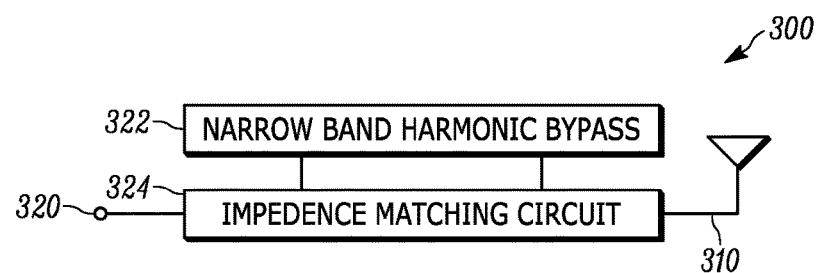
FIG. 3 is a block diagram of an exemplary single port wide band impedance matching circuit.

FIG. 3 illustrates a block diagram 300 of an exemplary single port wide band impedance matching circuit. The exemplary single port wide band impedance matching circuit includes a single port 320 coupled to an antenna 310 via a narrow band harmonic bypass circuit 322 and an impedance matching circuit 324.

Figure 4:
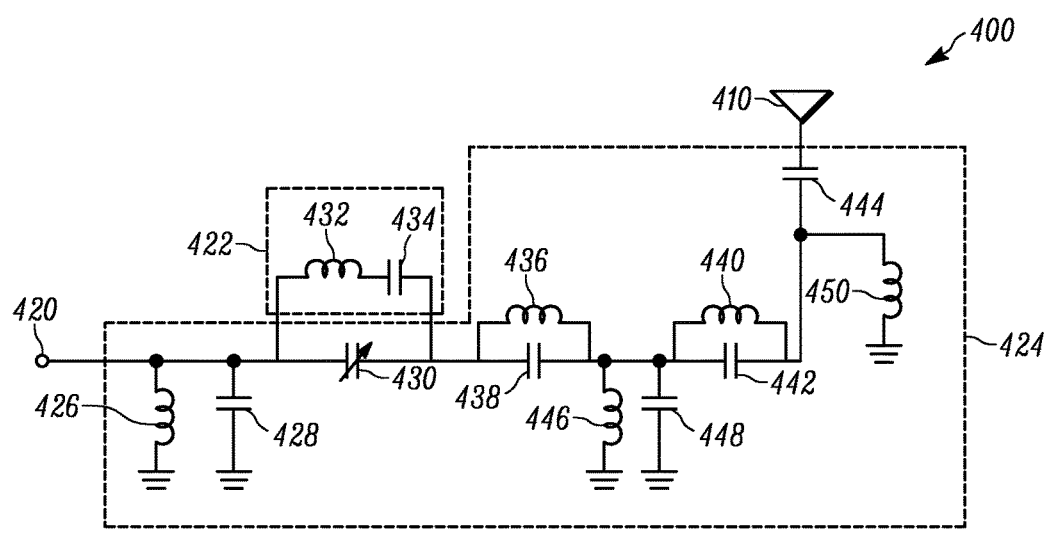
FIG. 4 is a more detailed circuit schematic of an exemplary single port wide band impedance matching circuit, illustrated in FIG. 3.

FIG. 4 illustrates a block diagram 400 of a more detailed circuit schematic of an exemplary single port wide band impedance matching circuit, illustrated in FIG. 3. In the illustrated embodiment, the single port 420 is coupled to the antenna 410 via an impedance matching circuit 424. A narrow band harmonic bypass circuit 422 is coupled to the impedance matching circuit 424. In the particular embodiment illustrated, the narrow band harmonic bypass circuit 422 includes a series combination of an inductor 432 and a capacitor 434, which is coupled in parallel with a tunable antenna matching capacitor 430 of the impedance matching circuit 424. Together, the narrow band harmonic bypass circuit 422 provides a narrow band attenuation at a predetermined frequency that can be controlled through the selection of the value of the inductor 432 and the capacitor 434. The narrow band harmonic bypass circuit 422 has the effect of trapping at least some of the energy present at the selected predetermined frequency, and preventing the energy at this frequency from propagating between the antenna 410 and the single port 420 which in turn can be coupled to the one or more transceivers 208 via the front end multiplexer circuit 211.

A further network of inductors and capacitors comprising a ladder network of alternating shunt and series component groupings, form the impedance matching circuit 424, and serve to couple the single port 420 to the antenna 410. More specifically, the impedance matching circuit 424 includes a first component grouping in shunt, including in a first capacitor 428 in parallel with a first inductor 426, a second component grouping in series including a first tunable capacitor 430 and a second inductor 436 in parallel with a second capacitor 438, a third component grouping in shunt including a third inductor 446 in parallel with a third capacitor 448, a fourth component grouping in series including a fourth inductor 440 in parallel with a fourth capacitor 442, a fifth component grouping in shunt including a fifth inductor 450, and a sixth component grouping in series including capacitor 444.

The impedance matching circuit 424 serves to better match the impedance of the antenna 410 to the circuit elements coupled to single port 420, which in turn facilitates more of the power associated with any signal at the single port being relayed between the antenna and the circuit element coupled to the single port 420, such as the one or more transceivers 208. The inductor and capacitor values of the impedance match circuit 424 are designed to transform the antenna impedance to the transceiver reference impedance. More specifically, the design is such that the input impedance is substantially equal to the transceiver reference impedance, typically 50 Ohms, and the output impedance is substantially equal to the complex conjugate of the antenna 410 impedance, which is the impedance needed to maximize the transfer of power into and out of the antenna 410. The instantaneous bandwidth within which the impedance can be transformed to the transceiver reference impedance depends on the mismatch between the antenna impedance and the transceiver reference impedance. For small antennas, the mismatch tends to be large, resulting in low instantaneous antenna bandwidth. The tunable capacitor 430 is employed to adjust the matching circuit thereby enabling the antenna to be matched over a range of frequency bands greater than the instantaneous bandwidth.

The tunable capacitor 430 can be implemented using one or more of various technologies including devices based upon Micro-Electro-Mechanical Systems (MEMS), Barium Strontium Titanate (BST), and solid state FET switches built on insulated CMOS wafers (SOI/SOS). In at least one embodiment, tunable capacitors of the type including Barium Strontium Titanate (BST) are used, which allows the capacitance to vary through the application of a voltage to the device. The particular value of the tunable capacitors may be controlled by one of the processors and/or one of the transceivers. With most tunable capacitor technologies the capacitor linearity is lower than an equivalent fixed capacitor. Thus the tunable capacitor 430 tends to generate harmonics which can be attenuated by the harmonic bypass circuit 422. The harmonic bypass 422 can be employed to attenuate harmonics from other series connected non-linear devices in the signal path, such as the antenna feed connector which can generate harmonics due to passive intermodulation.

The harmonic bypass circuit 422, being a series connected L, inductor 432, and C, capacitor 434, provides an equivalent short circuit at the resonant frequency, $F_{RES}=1/(2*\pi*SQRT(LC))$. When designed for $F_{RES}$ equal to a harmonic frequency, and connected in parallel with the tunable capacitor 430, the harmonic bypass circuit 422 attenuates the harmonics generated by the tunable capacitor 430. The harmonic bypass circuit 422 'looks' like a small capacitor at the fundamental frequency, and does not significantly affect the tuning operation of capacitor 430. Furthermore, the harmonic bypass circuit 422 'looks' like a short circuit at the harmonic frequency, which can be implemented to reduce the constraints on the design of matching circuit 424 for operation in bands which include the harmonic frequency. In this way matching circuit 424 can be designed with harmonic bypass circuit 422 such that transceivers 208 transmit in a first band and simultaneously receive in a second band which is harmonically related to the first band, such that the antenna is well matched in the first and the second bands and the receiver is not desensitized.

Figure 5:
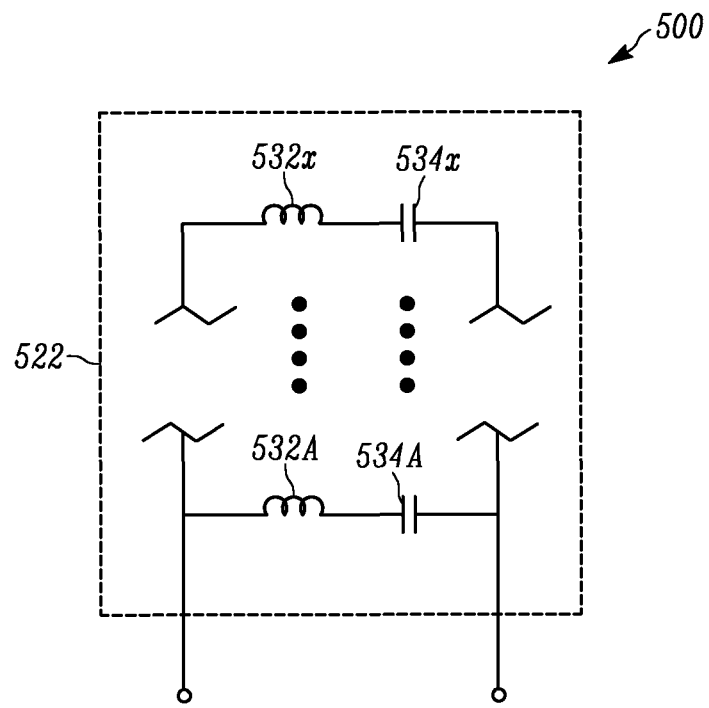
FIG. 5 is a circuit schematic of a further exemplary narrow band harmonic bypass circuit.

While the use of a single tunable narrow band harmonic bypass circuit 322 is shown, for use in the exemplary single port wide band impedance matching circuit, it is possible that additional tunable narrow band harmonic bypass circuits could be used to account for and trap more than one harmonic frequency that might be of concern, i.e. by placing additional series inductor and capacitor instances of the harmonic bypass circuit, designed for different resonant frequencies, in parallel with the first series inductor 432 capacitor 434 combination of the harmonic bypass circuit 422. Such an example is illustrated in FIG. 5, which illustrates a circuit schematic 500 of a further exemplary narrow band harmonic bypass circuit 522. The further exemplary narrow band harmonic bypass circuit 522 includes a first series inductor 532A and capacitor 534A combination, as well as one or more additional series inductor 532x and capacitor 534x combinations in parallel with the first combination. As noted above each combination can be used to trap a different frequency.

Figure 6:
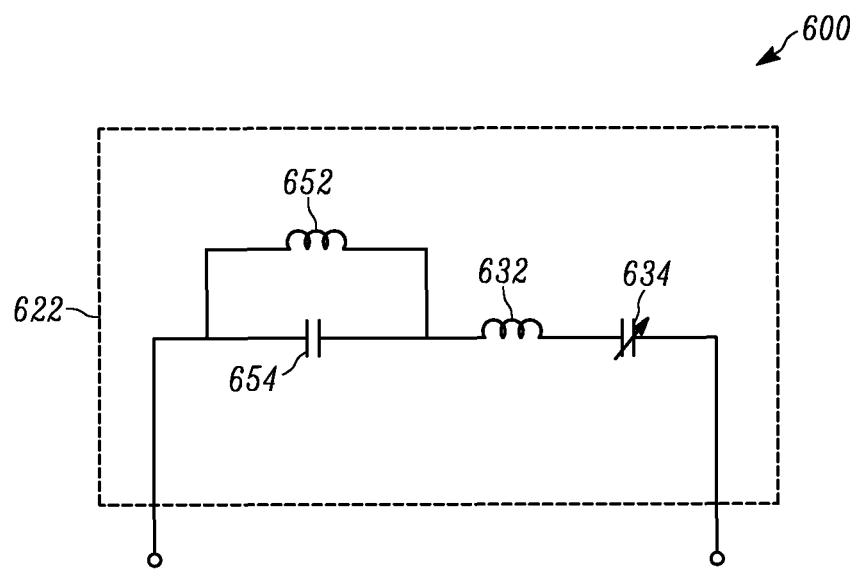
FIG. 6 is a circuit schematic of an exemplary tunable narrow band harmonic bypass circuit.

Additionally and/or alternatively, the harmonic bypass circuit can be tunable by employing tunable capacitor technology for the capacitor 434. Such an example is illustrated in FIG. 6, which includes a circuit schematic 600 of a still further exemplary narrow band harmonic bypass circuit 622. The still further exemplary narrow band harmonic bypass circuit 622 includes a series inductor 632 and capacitor 634 combination, where the capacitor 634 is tunable. However, as noted above with respect to other tunable capacitors, a reduced linearity which can be associated with at least some types of tunable capacitors, can be the source of unwanted harmonics. In order to address any unwanted harmonics from tunable capacitor 634, which could similarly contribute to a desensitization of the one or more transceivers 208, a parallel inductor 652 and capacitor 654 combination having a resonant frequency at the fundamental could be coupled in series with the series inductor 632 and capacitor 634 combination of the harmonic bypass circuit 622. The parallel inductor 652 and capacitor 654 combination 'looks' like a large capacitor at the harmonic frequency which can be accounted for such that the bypass circuit 322 has the desired resonant frequency at the harmonic frequency. Since the parallel inductor 652 and capacitor 654 combination has a high impedance at the fundamental frequency the RF voltage across capacitor 634 is lower than the RF voltage across tunable capacitor 430 at fundamental, and the harmonic generation from capacitor 634 is thereby reduced relative to the harmonic generation from tunable capacitor 430. By incorporating a tunable capacitor as part of the narrow band harmonic bypass circuit 622, the particular frequency at which the harmonics are bypassed can be tuned and/or adjusted.

Figure 7:
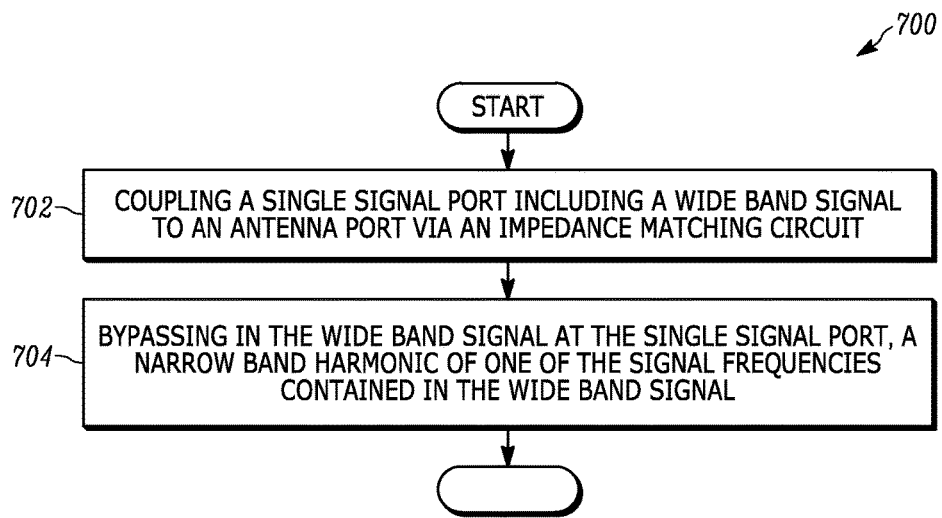
FIG. 7 is a flow diagram of a method for providing antenna matching.

FIG. 7 illustrates a flow diagram 700 of a method for providing antenna matching. The method includes coupling 702, a single signal port including a wide band signal to an antenna port via an impedance matching circuit. The method further includes bypassing 704 in the wide band signal at the single signal port, a narrow band harmonic of one of the signal frequencies contained in the wide band signal.

Figure 8:
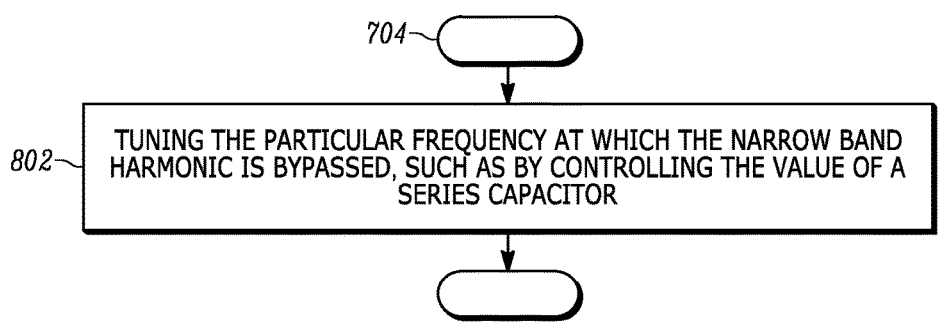
FIG. 8 is a flow diagram of a method of bypassing in a wide band signal a narrow band harmonic.

FIG. 8 illustrates a flow diagram 800 of a method of bypassing in a wide band signal a narrow band harmonic. Bypassing the narrow band harmonic of one of the signal frequencies contained in the wide band signal includes tuning 802 the particular frequency at which the narrow band harmonic is bypassed. In at least some instances, the tuning can be achieved by controlling the value of a series capacitor.

While the preferred embodiments have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A wide band impedance matching circuit comprising:
a single signal port adapted for receiving a wide band signal;
an impedance matching circuit including a narrow band harmonic bypass, the narrow band harmonic bypass being configured to produce a short at a predetermined frequency, which corresponds to a harmonic of a lower frequency signal included as part of the wide band signal received at the single signal port; and
an antenna port coupled to the single signal port via the impedance matching circuit.

2. A wide band impedance matching circuit in accordance with claim 1, wherein the impedance matching circuit includes a tunable antenna matching capacitance, and the narrow band harmonic bypass includes a series impedance in parallel with the tunable antenna matching capacitance of the impedance matching circuit.

3. A wide band impedance matching circuit in accordance with claim 2, wherein the series impedance of the narrow band harmonic bypass is tunable.

4. A wide band impedance matching circuit in accordance with claim 3, wherein the tunable series impedance of the narrow band harmonic bypass includes a tunable series capacitor.

5. A wide band impedance matching circuit in accordance with claim 4, wherein the tunable series impedance of the narrow band harmonic bypass additionally includes a secondary trap comprising a combination of an inductor coupled in parallel with a capacitor, where the combination is coupled in series with the tunable series capacitor.

6. A wide band impedance matching circuit in accordance with claim 1, wherein the single signal port is coupled to one or more transceivers.

7. A wide band impedance matching circuit in accordance with claim 6, wherein the single signal port is coupled to one or more transceivers via a front end circuit including a diplexing circuit.

8. A wide band impedance matching circuit in accordance with claim 7, wherein the diplexing circuit includes one or more diplexers for merging signals from the one or more transceivers with the single signal port.

9. A wide band impedance matching circuit in accordance with claim 6, wherein the one or more transceivers are associated with one or more signals having frequencies which span a predetermined wide signal band.

10. A wide band impedance matching circuit in accordance with claim 1, wherein the wide band signal includes at least a lower band signal and a higher band signal.

11. A wide band impedance matching circuit in accordance with claim 10, wherein the lower band signal and the higher band signal, together, support carrier aggregation.

12. A wide band impedance matching circuit in accordance with claim 1, which is incorporated as part of a wireless communication device.

13. A wide band impedance matching circuit in accordance with claim 12, wherein the wireless communication device is a radio frequency cellular telephone.

14. A wide band impedance matching circuit in accordance with claim 1, wherein the wide band signal includes an ultra low band signal, a low band signal, a mid band signal, and a high band signal.

15. A wireless communication device comprising:
one or more transceivers;
a single signal port coupled to the one or more transceivers, the single signal port including a wide band signal;
an impedance matching circuit including a narrow band harmonic bypass, the narrow band harmonic bypass being configured to produce a short at a predetermined frequency, which corresponds to a harmonic of a lower frequency signal included as part of the wide band signal received at the single signal port;
an antenna port coupled to the single signal port via the impedance matching circuit; and
an antenna coupled to the antenna port.

16. A method for providing antenna matching, the method comprising:
coupling a single signal port including a wide band signal to an antenna port via an impedance matching circuit; and
bypassing in the wide band signal at the single signal port, a narrow band harmonic of one of the signal frequencies contained in the wide band signal using a narrow band harmonic bypass which is configured to produce a short at a predetermined frequency, which corresponds to the narrow band harmonic of a lower frequency signal included as part of the wide band signal received at the single signal port.

17. A method in accordance with claim 16, wherein bypassing in the wide band signal a narrow band harmonic includes tuning the particular frequency at which the narrow band harmonic is bypassed.

18. A method in accordance with claim 17, wherein tuning the particular frequency includes controlling the value of a series capacitor.

* * * * *